US006891655B2

(12) United States Patent
Grebinski et al.

(10) Patent No.: US 6,891,655 B2
(45) Date of Patent: May 10, 2005

(54) HIGH ENERGY, LOW ENERGY DENSITY, RADIATION-RESISTANT OPTICS USED WITH MICRO-ELECTROMECHANICAL DEVICES

(75) Inventors: Thomas J. Grebinski, Alamo, CA (US); Ulrike A. Dauderstadt, Dresden (DE); Torbjörn Sandström, Pixbo (SE); Ulric B. Ljungblad, Molndal (SE); Christian Kunath, Dresden (DE); Eberhard Kurth, Boxdorf (DE)

(73) Assignee: Micronic Laser Systems AB, Taby (SE)

( * ) Notice: Subject to any disclaimer, the term of this patent is extended or adjusted under 35 U.S.C. 154(b) by 39 days.

(21) Appl. No.: 10/335,981

(22) Filed: Jan. 2, 2003

(65) Prior Publication Data

US 2004/0130775 A1 Jul. 8, 2004

(51) Int. Cl.[7] .............................................. G02B 26/00
(52) U.S. Cl. ...................... 359/291; 359/290; 359/292
(58) Field of Search ................................ 359/291, 290, 359/292, 295, 297, 298, 238, 237, 872, 873, 874, 871

(56) References Cited

U.S. PATENT DOCUMENTS 6,392,233 B1 * 5/2002 Channin et al. ......... 250/338.1
2003/0016337 A1    1/2003 Duncan et al.

OTHER PUBLICATIONS

H. Helvajian et al. "Photophysical Processes in Low–fluence UV Laser–Material Interaction and the Relevance to Atomic Layer Processing" presented at NATO/ASI Workshop, Portugal, Advanced Materials for Optics and Electronics, vol. 2, 31–42 (1993).

D.G. Stearns et al. "Nonspecular Scattering in EUV Lithography: Determining Specifications for Surface Finish" OSA TOPS on Extreme Ultraviolet Lithography 1996, vol. 4, Optical Society of America, pp. 167–168.

P. Kadkhoda et al. "Investigation on Total Scattering at 157nm and 193nm" Proc. SPIE vol. 4099, pp. 65–73, Nov. 2000.

Angela Duparre et al. "Influence of Substrate Surface and Film Roughness on the Quality of Optical Coatings for the UV Spectral Region" Proc. SPIE vol. 3110, p. 509–516, Sep. 1997.

N. Kaiser et al. "High Damage Threshold A12O3/SiO2 Dielectric Coatings for Excimer Lasers" Thin Solid Films 260 (1995) pp. 86–92.

* cited by examiner

*Primary Examiner*—Timothy Thompson
(74) *Attorney, Agent, or Firm*—Ernest J. Beffel, Jr.; Haynes Beffel & Wolfeld LLP (57) ABSTRACT

The present invention includes methods and devices that improve the radiation-resistance of a movable micromechanical optical element. In particular, a radiation-resistant layer is added to a movable micro-mechanical optical element, suitable to reduce the surface and bulk material changes to the element that result from exposure to pulsed laser energy densities less than 100 micro-joules per square centimeter and at wavelengths less than or equal to about 248 nm.

46 Claims, 5 Drawing Sheets

Fig. 9

HIGH ENERGY, LOW ENERGY DENSITY, RADIATION-RESISTANT OPTICS USED WITH MICRO-ELECTROMECHANICAL DEVICES

FIELD OF THE INVENTION

The present invention includes methods and devices that improve the radiation-resistance of a movable micromechanical optical element. In particular, a radiation-resistant layer is added to a movable micro-mechanical optical element, suitable to reduce the surface and bulk material changes to the element that result from exposure to pulsed laser energy densities less than 100 micro-joules per square centimeter and at wavelengths less than or equal to about 248 nm.

BACKGROUND OF THE INVENTION

Optical micro-electromechanical systems (MEMS) or Spatial Light Modulators (SLMs) are used today in movie and presentation projectors and in televisions to generate images for audiences. Patterns typically appear on large area surfaces such as projection screens or viewing plates. In these applications, visible-wavelength light (400–800 nm) is used. MEMS are also used as switches that direct beams of light from one optical pathway to another. In switching applications, visible-wavelengths of light are typically used, rather than shorter wavelength, ultraviolet light.

The inventors and their colleagues recently have applied SLMs to micro-lithographic processes involved in semiconductor device manufacture. SLMs are being used to generate finer, smaller, and more densely packed imagery. The delineation of the small, densely packed imagery requires use of short wavelengths of light within and below the ultraviolet spectrum. Electrostatic actuation is used to deflect micro mirrors. In order to produce a force, a voltage is generated between two electrodes, one stationary and another that is attached to an actuator for example the movable micromirror. An SLM with an array of actuators used in for example a mask writing tool or a chip-manufacturing tool, is loaded with a specific pattern, where actuators are in an addressed state or an unaddressed state when relaying or transmitting a beam of electromagnetic radiation onto a workpiece. This relayed beam of electromagnetic radiation comprises a stamp of a pattern to be printed on said workpiece. This pattern may be a subset of a pattern or a complete pattern to be printed on the mask or the chip respectively.

Accordingly, an opportunity arises to understand the problems of using SLMs with short wavelengths of light, including wavelengths of about 248 nm or less, and to develop methods and devices that adapt SLMs to use with short wavelengths, effectively extending the usefulness and life of MEMS elements.

SUMMARY OF THE INVENTION

The present invention includes methods and devices that improve the radiation-resistance of a movable micromechanical optical element. In particular, a radiation-resistant layer is added to a movable micro-mechanical optical element, suitable to reduce the surface and bulk material changes to the element that result from exposure to pulsed laser energy densities less than 100 micro-joules per square centimeter and at wavelengths less than or equal to about 248 nm.

DETAILED DESCRIPTION OF THE INVENTION

The following detailed description is made with reference to FIGS. 1–9 above. Preferred embodiments are described to teach the art of the invention and not to limit the scope of the claims defined herein. Those of ordinary skill in the art will recognize a variety of equivalent variations on the description that follows.

Microlithographic SLMs use arrays of very small, precise movable light modulating elements, or an optical element, such as mirrors. A reflective optical element can be from a few microns to tens of microns on a side. An SLM array including a plurality of such elements can be less than one centimeter on a side to tens of centimeters on a side. The thickness of an optical element may be 1–2 microns or 350–700 nm thick, or thinner and thicker. The desired flatness (the peak-to-trough curvature of a single reflective element) may be as precise as 4–10 nm across 16 microns, or better. Both surface flatness and mechanical stability (including resistance to edge curls) may be required. The desired life span of an element may be one to ten or one hundred billion pulses of radiation and a large number of mechanical flexures, as elements are adjusted to produce desired microlithographic patterns.

As compared to SLMs used to generate images for audiences, microlithographic SLMs use shorter wavelength light that has higher per-photon energy. Higher energy photons have a greater ability to materially alter the surface and bulk physicochemical properties of the optical elements. It has been observed during development that at short wavelengths of light, high energy photons can change the optical properties of an optical element. Generally, the per-photon net change in the properties of a reflective surface at constant fluence is inversely related to the wavelength of the incident electromagnetic radiation. Generally, the shorter the wavelength of electromagnetic radiation, the greater the per-photon change in the surface and/or bulk properties of the optical element. The resulting changes in the bulk and material properties of the optical element are irreversible and cumulative.

Changes in the properties of the microlithographic SLM optical elements are undesirable and irreversible, as the changes diminish the fidelity, and therefore the quality, of the generated imagery.

A reflective optical element is made of a desirably high reflectance material such as aluminum. Pulsed and incident high energy photons, at pulse rates greater than 500 Hz, and wavelengths less than or equal 248 nm, and at energy densities less than 100 micro-joules per square centimeter, are reflected from the surfaces of the movable optical elements. The impinging photons can interact with the surface and bulk properties of the optical elements.

The use of reflective SLM's is not limited to a use of such SLM's for laser pattern generation. The scope of the claims shall be intended to cover other movable and static, reflective and transmissive, optical elements that fall outside the use of such technology for laser-based pattern generation at such herein-specified energy densities and wavelengths; examples are, but not limited to scanning mirrors, photonic switches for telecommunications and MEMS shutter arrays.

The types of changes that can be expected are highly dependent on the surface and bulk properties of the optical element. Conductive, insulative and semiconducting materials behave differently when exposed to the same wavelength and fluence of light. The photon-induced changes in the bulk and surface properties of the optical elements can be measured directly or indirectly. Material changes to the mirrors may be quantified directly by a change in the hardness, chemical composition, the surface roughness, loss of material, film thickness or a change in the shape of the optical elements. Changes in the optical properties of the mirrors can be qualified through changes in reflectance, specular and non-specular reflectance, brightness or contrast.

It has been observed that the resist patterning processes that are used to define optical elements of an SLM leave behind residuals, as does exposure to the environment. From resist processes or other sources, residual carbon has been observed on the optical element surface. Sample structures (so-called mirrored samples) included a 350 nm thick aluminum/magnesium/silicon alloy film over photoresist. These sample structures were annealed for 12 hours at 160 Celsius. So-called "treated" structures were exposed to 90 million, 2.5 mJ/cm2, 25 ns, pulses of 248 nm laser light at 500 Hz. Other sample structures (so-called non-mirrored samples) comprised a 1000 nm thick aluminum/magnesium/silicon alloy film on a single crystal silicon substrate without annealing. Some non-mirrored samples were treated by exposure to low energy density, high-energy laser pulses. Sample structures were analyzed.

Analysis of the samples showed a high relative presence of carbon within the upper two monolayers of the surface. The carbon content decreased substantially at about 9 nm into the surface. An aluminum oxide layer appeared to be intermixed with the carbon. Nanogranules of alloy were observed at the surface, considered to be a byproduct of sputter deposition, as would be expected. The nanogranules appeared to be on the order of 20–25 nm in size. In some treated samples, it appeared that nanogranules of alloy had been ejected from the surface, cleanly removed leaving the adjacent granules unmodified and not moved at all, and leaving an uneven surface including holes 20–30 nanometers deep. The desorption of nanogranules from the surface is consistent with unrelated experimental results of H. Helvahan, L. Wiedman and H. S. Kim, "Photophysical Processes in Low-fluence UV Laser-Material Interaction and the Relevance to Atomic Layer Processing", Advanced Materials for Optics and Electronics, Vol. 2, pp. 31–42 at 40 (1993).

The surface hardness of the treated and untreated structures also was compared. A combination of force applied with a Hystiron TryboScope TM analyzer and results analyzed with AFM showed that the surface of the treated sample resisted penetration by the analysis probes more and thus was deemed to be harder than the untreated surface. TEM images of the treated mirrored sample showed a film considered likely to be a physicochemically non-homogeneous, carbon-rich, mixture of aluminum, oxygen, magnesium and silicon. It was surmised that a combination of loss of material (oxygen and nanogranules) and increased surface hardness was associated with a 5–20 nm curvature observed across the 16 micron wide face of a mirror structure after treatment.

From and consistent with these observations, methods were developed for treatment of optical MEMS that will be exposed to wavelengths at or below about 248 nm. A planarizing buff polish may be applied to mirrors prior to release of the mirrors from resist underlying the mirror structures or, more generally, to an optical MEMS structure that will be exposed to short wavelengths. A CMP buff polish preferably uses a very small abrasive particle to produce a low surface roughness. A buff polish may be adopted sufficient to smooth out the nanogranules from the surface of the optical MEMS, nanogranules thought to be associated with the post-exposure changes to the surface and bulk properties of the reflective optical elements. A buff polish may be adopted sufficient to remove nanogranules from the surface of the mirrors. At the appropriate pH and viscosity, etc., a silica-based slurry having 50 or 70 nm particle size is expected to work. More generally, an abrasive particle size of 300 nm or smaller is likely to work. Other slurries using different abrasives may work equally well. Slurries developed and sold by ATMI, Inc.'s ACSI group, under the trade name Planar Chem OS Series Oxide SMP Slurries, have the desired small particle sizes. The structure of these slurries is believed to be based on work described in U.S. Pat. Nos. 5,993,685, Planarization Composition for Removing Metal Films (30 Nov. 1999); U.S. Pat. No. 6,267,909, Planarization composition for removing metal films (31 Jul. 2001); and U.S. Pat. No. 6,322,600, Planarization compositions and methods for removing interlayer dielectric films (Nov. 27, 2001). Alternatively, a buff polish removing a range including about 5–30, 5–20, 5–10, 10–20, 20–30, 50–100 nm or 5, 10, 20, 30, 50 or 100 nm or less of material may be implemented, depending on the composition of the optical MEMS surface. The critical dimensions of a buff polish will vary with surface composition. The surface roughness can be observed and measured using atomic force microscopy.

Figure 9:
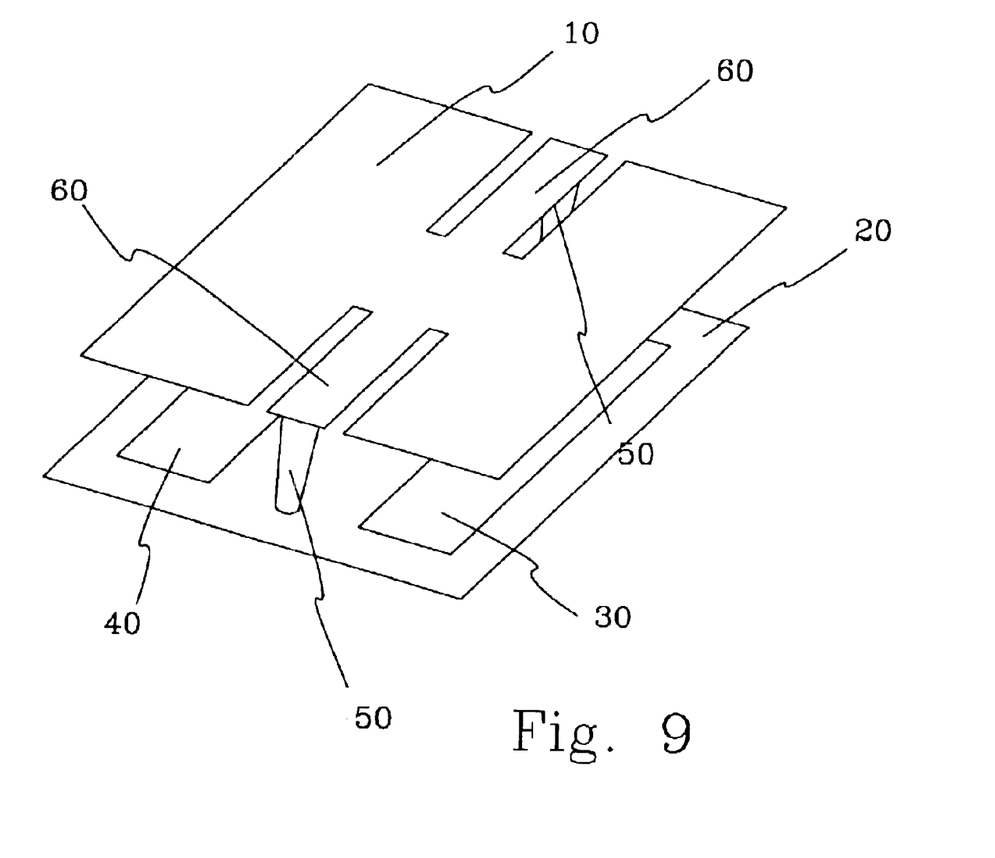
FIG. 9 depicts a perspective view of an example of a micro mirror structure.

FIG. 9 shows an embodiment of a movable micro-optical element. The movable optical element may be a mirror element in a spatial light modulator (SLM) array. Said mirror may be deflected through a range of deflection angles or to binary maximum and zero deflections. The deflection of the mirror element may be linear or non-linear as a function of the input signal.

In FIG. 9, the movable optical element 10 is a generally rectangular and supported along one of its mid-sections by a pair of torsion hinges 60. The movable optical element may have any form, for example polygonal, circular or elliptical. Said hinges are supported by support elements 50. The movable microelement 10, the torsion hinge 60, and the support element may be of the same material, for example aluminum or different materials. Substrate 20 comprises electrically conducting electrodes 30, 40. The electrodes 20, 30 are connected to circuitry (not shown) fabricated within the substrate 20. By applying a potential difference between one of the electrodes and said optical element an electrostatic force builds up, which electrostatically attracts (deflects) said movable optical element.

Figure 1:
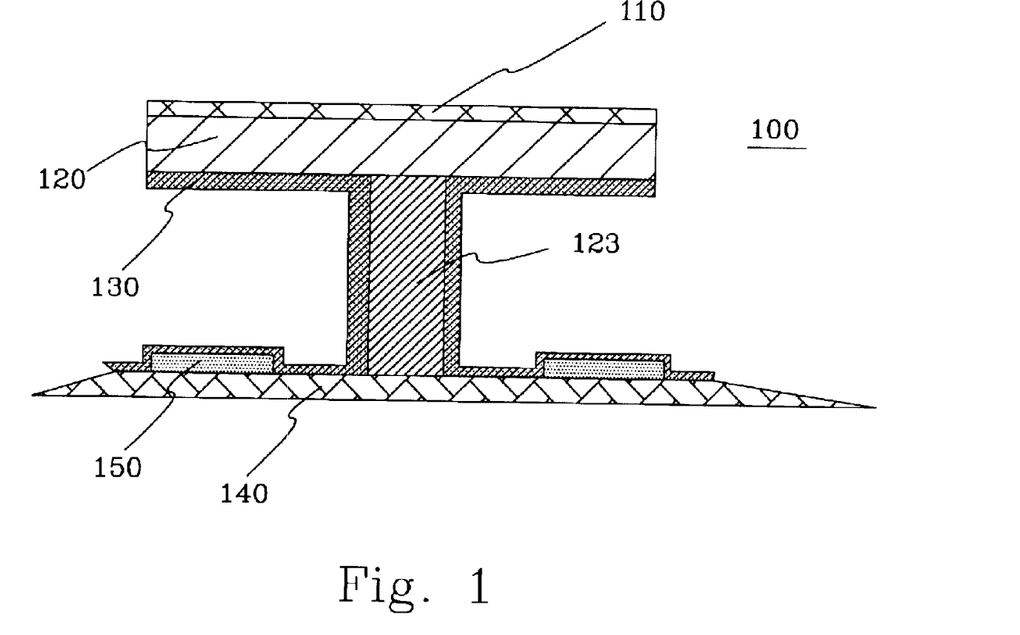
FIG. 1 depicts a cross sectional view of a first embodiment of an inventive MEMS structure.

FIG. 1 illustrates cross-section of a first embodiment of a micro-mirror structure 100. The structure 100 includes an optical element or front surface 120, a support structure 123, and a substrate 140. The support structure attaches the optical element 120 to the substrate 140. The substrate comprises at least one electrode used to electrostatically attract the element 120. The movable element, on its front surface, is layered with a radiation-resistant coating 110. The radiation-resistant layer 110 may be substantially reflective. A substantially reflective surface would be a reflectance preferably, but not limited to, a reflectance greater than 20 percent. This reflectance level is lower at high frequencies/low wavelengths than in the visual range. Reducing the energy density before contact with the front surface 120 reduces photon-induced damage to surface and bulk properties of the exposed reflective optical element 120 caused by low fluence, high energy photons. Low fluence is characterized to be a per-pulse fluence below 100 micro-joules per square centimeter. The mirror element 120 may be made of aluminum. Alternatively, it may comprise silicon nitride, silicon, titanium, tantalum or tungsten, with or without aluminum. The base structure of the movable optical element can be made of, but is not limited to, a material such as aluminum, silicon nitride, silicon, titanium, tantalum, tungsten or some other sufficiently non-ductile, interlayered or composite material that can be deflected sufficiently with what would be considered a nominal amount of elastic hysteresis. A reflective layer, not separately illustrated, may be applied, comprising aluminum, silver, gold or some other more suitable reflective surface.

The radiation-resistant layer 110 may be a layer, or a plurality of layers, made of oxides of hafnium, silicon, aluminum; yttrium or scandium; or fluorides of magnesium, calcium, lanthanum, lithium, molybdenum, sodium and aluminum, neodymium, gadolinium or aluminum; suicides of molybdenum; or even carbides of boron. For instance, four to six alternating layers of oxides of aluminum and silicon may be used. In other embodiments, many layers, as many as 50 or 100 layers may be used. The use of many layers is mentioned in a different context in Angela Duparré, Stefan Jakobs & Norbert Kaiser, "Influence of substrate surface and film roughness on the quality of optical coatings for the UV spectral region," SPIE Vol. 3110, pp. 509–516, which refers on page 510 to a system having 49 layers, and in N. Kaiser, H. Uhlig, U. B. Schallenberg, B. Anton, U. Kaiśer, K. Mann, E. Eva, "High Damage Threshold Al2O3/SiO2 dielectric coatings for excimer lasers," Thin Solid Films, No. 260, pp. 86–92 (1995), which refers on page 87 to a 24 layer system. The radiation-resistant layer may be applied by known deposition and ion implantation techniques. Deposition techniques include sputtering, CVD, electron evaporation, laser evaporation, and laser or plasma enhanced oxidation.

The reflective surface of the mirror, prior to the application of the desired radiation-resistant coating, can be smoothed by chemical mechanical polishing (CMP) or some other more suitable surface smoothing technique, as described above. It is desirable that the front surface of the movable optical element have a high degree of smoothness. This is believed to help decouple the interaction of an incident photon with the surface. The surface smoothness of the optical element should be less than 2 nm RMS (root mean square), more preferably less than 1 nm RMS and yet more preferably less than 0.5 nm RMS.

It is anticipated that such a radiation-resistant coating will substantially reduce the loss of reflectivity or damage resulting from multiple cumulative pulses exceeding one billion to low fluence photons having wavelengths less than or equal to 248 nm. It is anticipated that the surface will remain flatter with each cumulative pulse.

The embodiment in FIG. 1 shows an antireflective coating 130 on the back surface of said mirror element 120, on said support structure 123 and on the underlying substrate 140 including said at least one electrode 150. The antireflective coating 130 may be made of one or a plurality of layers of a fluoride of magnesium or calcium or an oxide of silicon and/or aluminum or some other more suitable coating that has antireflective properties at the wavelength used. The antireflective coating 130 reduces possible spurious reflections underneath the reflective surfaces of the SLM elements that can contribute to the degradation of the fidelity of the reflected imagery created by the optical element of the SLM. Furthermore, the antireflective nature of such a radiation-resistant coating can offer protection to the underlying circuitry that may be sensitive to such high-energy, short-wavelength, photons.

The thickness of the radiation-resistant coating is typically in the range of 2–150 nm. Preferably, 5–100 nm and more preferably 10–50 nm.

The thickness of the anti-reflective coating is typically in the range of 15–80 nm. Preferably, 15–70 nm and more preferably 20–60 nm.

Comparing the cross-section in FIG. 1 and the isometric view of FIG. 9, it is apparent that the central, vertical structure 123 need not have the same footprint as the light modulating structure 120. That is, a torsional hinge 60 may be formed with supports 50 at either end. Many reflective and transmissive geometries may benefit from application of the present invention, having various structures to support the light modulating structure 120.

Figure 2:
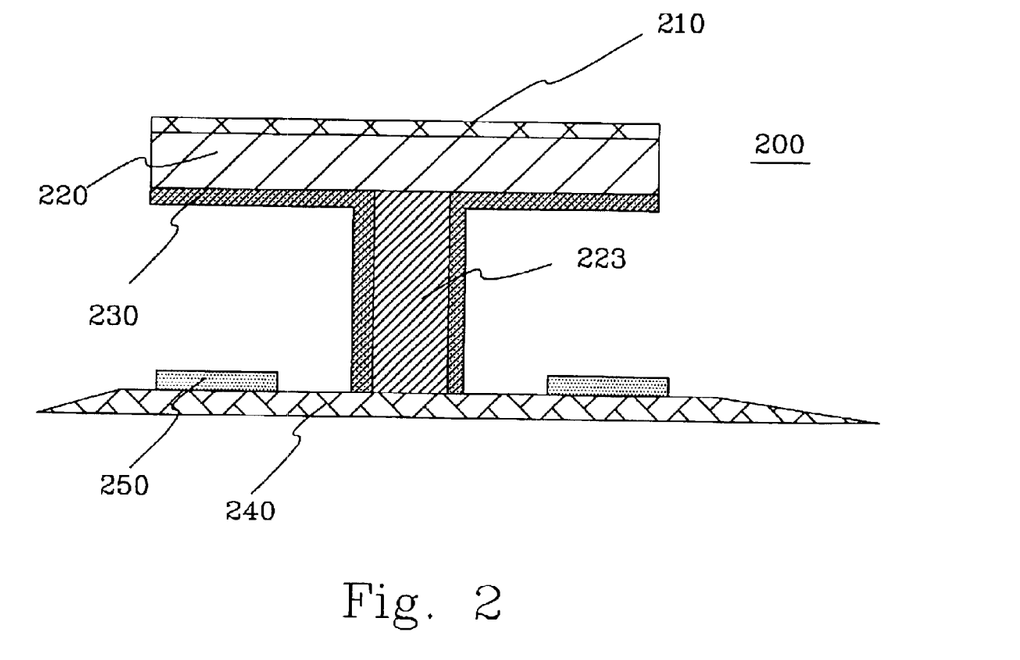
FIG. 2 depicts a cross sectional view of a second embodiment of an inventive MEMS structure.

FIG. 2 illustrates a cross sectional view of a second embodiment of an inventive micro mirror structure 200. Said structure 200 comprises an optical element 220, a support structure 223 and a substrate 240. The support structure attaches the optical element 220 to said substrate 240. The substrate comprises at least one electrode that electrostatically attracts said optical element 220. The mirror element is covered with a radiation-resistant coating 210. Said coating substantially reduces the photon-induced bulk and surface affects for the reflective element 220 when exposed to low fluence photons at wavelengths less than or equal to 248 nm.

The reflective optical element 220 may be made of aluminum or some other more wavelength-suitable reflective coating or substrate. The radiation-resistant coating 210 may be made of one or more oxides of hafnium, aluminum or silicon or fluorides of calcium, magnesium or lithium or carbides of boron. Metals like platinum, palladium, ruthenium, rhodium, rhenium, osmium or iridium can be used as radiation-resistant coatings as well. A single or multi-layer coating may be applied. The radiation-resistant coating 210 may be applied by known deposition and/or ion implantation techniques known in the art. An ion implanted optical element may be activated and rendered radiation resistant by a post implant anneal using standard annealing procedures commonly known to those skilled in the art. The top surface of the uncoated reflective optical element may be smoothed before forming the radiation-resistant coating 210.

The radiation-resistant coating 210 will substantially reduce the rate of loss of brightness and contrast from one billion plus superimposed exposures to low fluence wavelengths of light less than or equal to 248 nm. The radiation-resistant coating 210 increases the resistance to said radiation from the range of hundreds of million pulses to billions of pulses with equal reflective loss. The radiation-resistant coating protects the surface from photon-induced chemical and physical changes, partly by forming a barrier that reduces the number of photons that reach the reflective surface and by locking in place the atoms and electrons of the reflective optical element.

The embodiment in FIG. 2 is also illustrated, like FIG. 1, to have an antireflective coating 230 on a back surface of said mirror element 220 and on at least part of said support structure 223 but not on the underlying substrate 240 including said at least one electrode 250. The antireflective coating 230 may be made of one or a plurality of layers formed by the deposition of a fluoride of magnesium or calcium or an oxide of silicon and/or aluminum or some other more suitable coating that has antireflective properties at the wavelength used. Said antireflective coating 230 reduces the spurious reflections underneath the reflective surfaces of the SLM elements that can contribute to the degradation of the fidelity of the reflected imagery created by the reflective optical element of the SLM. Furthermore, the antireflective nature of such a coating can offer protection to the underlying circuitry that may be sensitive to such high-energy, short-wavelength, photons.

Figure 3:
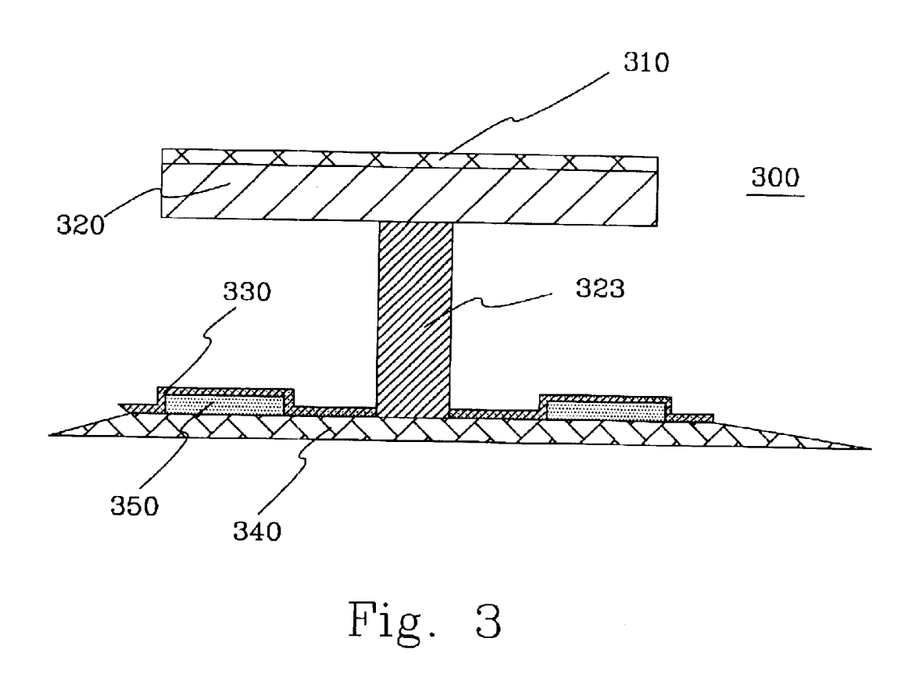
FIG. 3 depicts a cross sectional view of a third embodiment of an inventive MEMS structure.

FIG. 3 illustrates a third embodiment of a micro mirror structure 300. In this embodiment, the anti-reflective coating 330 is illustrated to only cover the substrate 340 comprising said at least one electrode 350. The back surface of said mirror element 320 and said support structure is not covered with said anti reflective coating.

Figure 4:
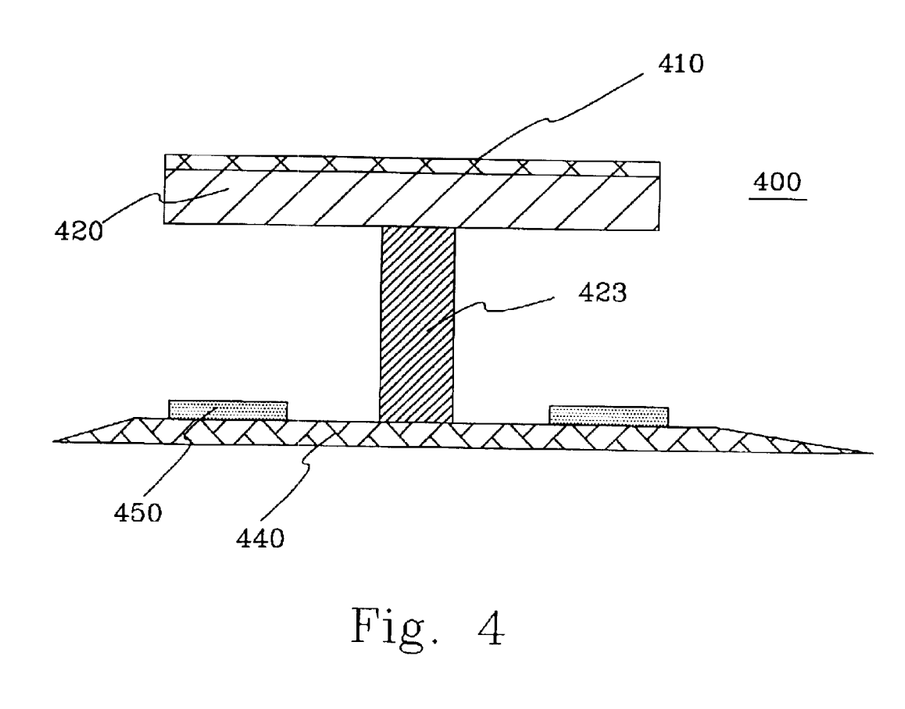
FIG. 4 depicts a cross sectional view of a fourth embodiment of an inventive MEMS structure.

FIG. 4 illustrates a fourth embodiment of a micro mirror structure 400. Said structure 400 comprises, like the other embodiments, a mirror element 420, a support structure 423, a substrate 440 and at least one electrode 450. The mirror element 420 is covered with a radiation-resistant coating 410. In this embodiment the anti-reflective coating is completely omitted.

In the embodiments illustrated in FIGS. 1, 2, 3, and 4 the mirror element may be considered to comprises an optical element and a structural element. The optical and structural element may be made of one base material such as aluminum or an alloy of aluminum.

Figure 5:
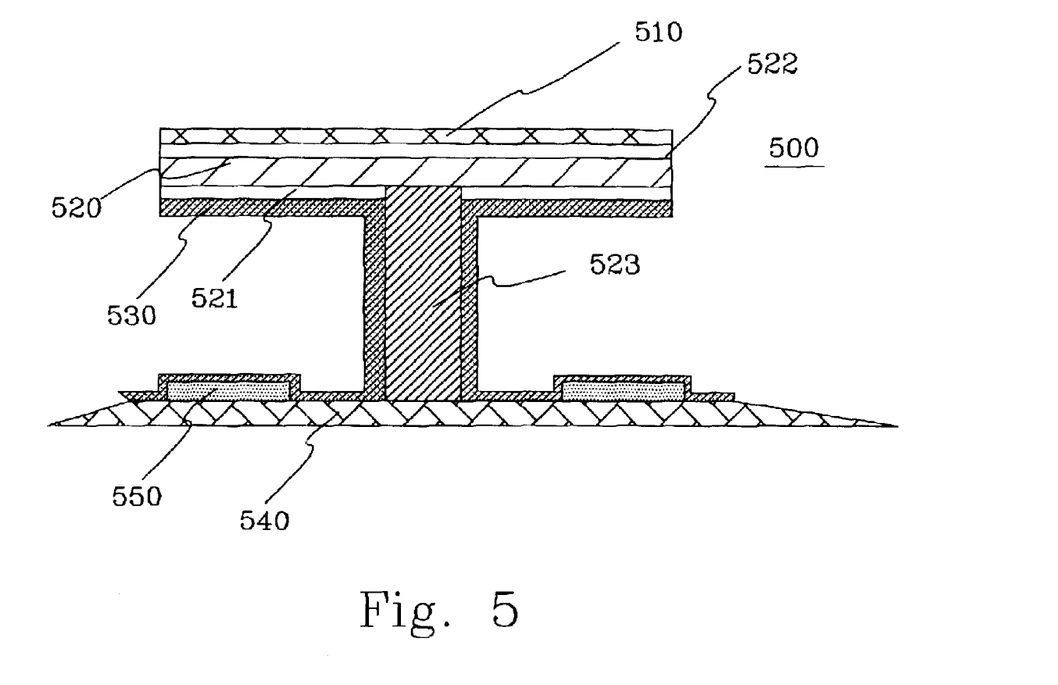
FIG. 5 depicts a cross sectional view of a fifth embodiment of an inventive MEMS structure.
Figure 6:
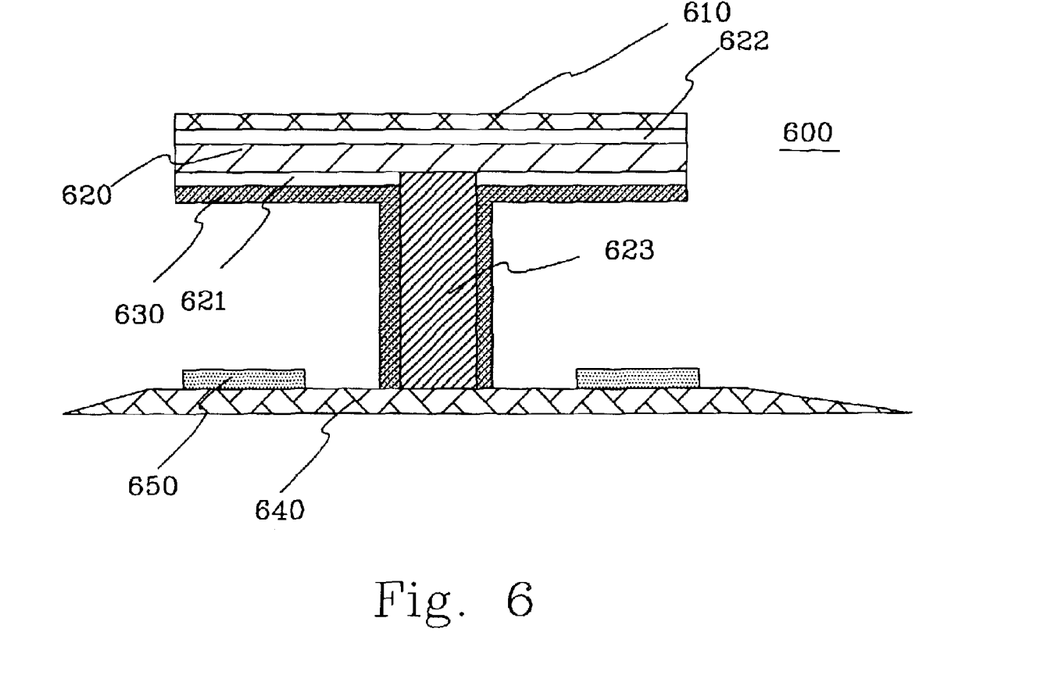
FIG. 6 depicts a cross sectional view of a sixth embodiment of an inventive MEMS structure.
Figure 7:
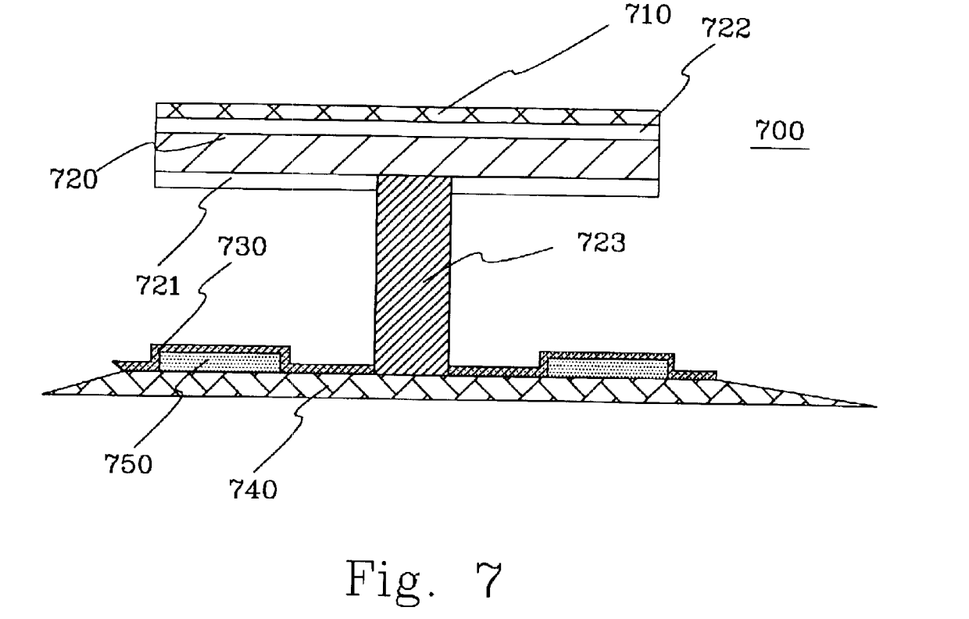
FIG. 7 depicts a cross sectional view of a seventh embodiment of an inventive MEMS structure.
Figure 8:
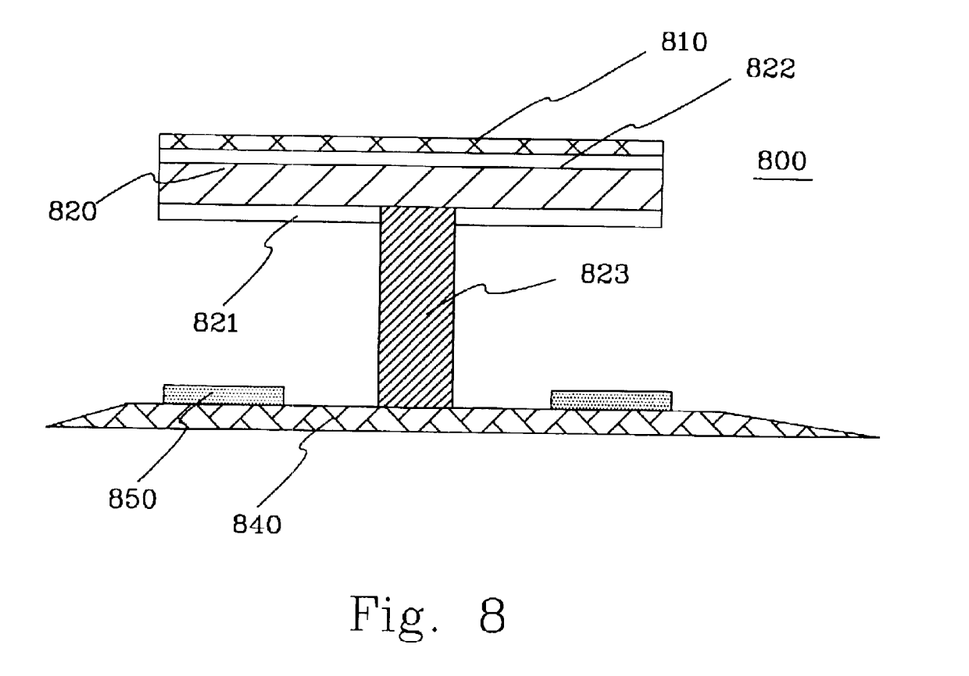
FIG. 8 depicts a cross sectional view of an eighth embodiment of an inventive MEMS structure.

FIG. 5 depicts yet another embodiment according, in which a mirror structural element 520 may be covered with an optical element on its front surface 522, its back surface 521 or both. The mirror structural element 520 may, in this case, be made of a more non-ductile material such as silicon nitride, titanium, tantalum, tungsten or some other more suitable non-ductile material exhibiting little or no deflective hysteresis, such as silicon or a composite of similar non-ductile materials.

The micro mirror structure 500 is very similar to the one illustrated in FIG. 1. The mirror structural element 520 may be made of a single elemental composition or may be an alloy such as an alloy of aluminum, copper and silicon. Furthermore, the structural element 520 may also be a stacked structure, comprising a plurality of layers of different materials. The material in said stacked structure may be designed to effectively minimize any temporary deformation of the mirrors where the temporary deformation lasts longer than the time between pulses.

The optical element 522, may be aluminum, an alloy of aluminum, silver, gold or any other suitable material having high reflectivity.

The radiation-resistant element 510, can be one layer or a plurality of layers as specified above.

Aluminum micro mirrors may be hardened with boron carbide. Boron carbide may be applied to aluminum micro mirrors by ion implantation of boron ions and carbon ions. After implantation, the micro mirrors may annealed, for instance by a thermal anneal.

The reference numerals in FIG. 5 correspond to the reference numerals in FIG. 1, with the number 100 being exchanged with the number 500. The same applies to FIGS. 6–8, where features in FIG. 6 corresponds to FIG. 2, FIG. 7 to FIG. 3 and FIG. 8 to FIG. 4. The descriptions above apply to the features depicted in FIGS. 6–8.

One aspect of the present invention is a method to improve the resistance to radiation-induced damage of an optical micro-electromechanical system (MEMS). A MEMS may comprise at least one movable modulating element. Damage to modulating elements may result from cumulative pulses of low-fluence, short wavelength electromagnetic radiation. In this context, low-fluence means low energy density. The method includes forming at least one radiation-resistant layer on a front side of at least one movable modulating element. According to this method, the radiation-resistant layer may be substantially reflective at an operating wavelength of about 240 nm or less. The radiation-resistant layer may include at least one oxide of hafnium, aluminum or silicon. It may include at least one fluoride of magnesium, lanthanum or lithium. It may include combinations of oxides and fluorides. Alternatively, it may include an implanted layer. This layer would be implanted on the front side of the movable modulating element. The implants may include boron and carbon. The implants may be activated. The annealing may be used for activation, such as thermal annealing. The radiation-resistant layer or layers may have a thickness of about 30 nm to 70 nm. Alternatively, it may have a thickness of about 2 nm to 50 nm or 50 to 100 nm. The movable modulating element may comprise aluminum, or one or more of the materials silicon nitride, silicon, titanium, tantalum or tungsten. The material composition for the radiation-resistant layer may be an averaged bulk composition from an upper portion of the layer to a lower portion of the layer. A reflective layer may be formed prior to forming the radiation-resistant layer. The reflective layer may include one or more of aluminum, silver or gold. The movable modulating element may have a backside and the method may further include forming an anti-reflective layer or layers on the backside of the element. The antirefleclive layer or layers may comprise a fluoride of magnesium or calcium. The thickness of the antireflective layer or layers may be 15 to 100 nm or, alternatively, 40 to 60 nm or 60 to 80 nm. The movable modulating element may be reflective or transmissive. In this context, transmissive means substantially transparent to wavelengths less than or equal to 248 nm. The movable modulating element may comprise silicon, an oxide of silicon or aluminum or an oxide of aluminum. Another aspect of this embodiment is that, prior to forming the radiation-resistant layer, the front side of the movable modulating element may be planar. The result of planarizing may be a root means squared flatness better than 2 nm, preferably better than 1 nm and more preferably better than 0.5 nm across the surface of an element. In this context, an element may be 16 microns across; more or less. Planarizing may be performed using an abrasive particle size of less than 300 nm, such as about 70 nm or about 50 nm. Elements and aspects described herein may be combined in a wide variety of useful combinations.

Corresponding to the methods described above, devices result. One embodiment of the present invention is at least one movable modulating element of an optical MEMS comprising a front side and at least one radiation-resistant layer over the front side. The radiation-resistant layer may be substantially reflective of radiation at wavelength of 248 nm or less. The radiation resistant layer may include any of the compositions described herein. The flatness characteristics of the element may be as described in the method. Radiation-resistant layers may be combined with one or more anti-reflective layers formed on a supporting non-movable substrate, on the back of the movable modulating element, or both.

While the present invention is disclosed by reference to the preferred embodiments and examples detailed above, it is understood that these examples should not limit the scope of the invention. It is contemplated that modifications and combinations of the above disclosed art would readily occur to those skilled in the art. Such modifications and combinations will be viewed as within the scope of the invention and the following claims. Further, the preferred embodiment is described with reference to a movable reflective SLM optical element and device. It should be understood by one of ordinary skill in the art that MEMS structures other than reflective SLMs, such as transmissive SLM's, may benefit from aspects of the present invention. For transmissive SLMs, radiation-resistant layers, formed over transmissive structures, may be chosen that are not substantially reflective. For instance, anti-reflective layers may be formed over a front or back side of the transmissive structure.

What is claimed is:

1. A method to improve the resistance to radiation-induced damage in an optical micro-electromechanical system (MEMS) comprising at least one movable modulating element, said damage resulting from cumulative pulses of low-fluence, short wavelength electromagnetic radiation, comprising the action of:

forming at least one radiation-resistant layer on a front side of at least one movable modulating element.

2. The method according to claim 1, wherein said radiation-resistant layer is substantially reflective at an operating wavelength of about 248 nm or less.

3. The method according to claim 1, wherein said radiation-resistant layer includes at least one of oxide of hafnium (HfaOb), fluoride of magnesium (MgeFx), fluoride of lanthanum (LapFx), oxide of aluminum (AlsOt) oxide of silicon (SiyOx) or fluoride of lithium (LikFz).

4. A method according to claim 1, wherein said radiation-resistant layer includes an oxide of hafnium, an oxide of aluminum or an oxide of silicon.

5. A method according to claim 1, wherein said radiation-resistant layer includes a fluoride of magnesium, a fluoride of calcium or a fluoride of lithium.

6. A method according to claim 1, wherein said radiation-resistant layer is an implanted layer at the front side of the movable modulating element.

7. A method according to claim 6, wherein said implanted radiation-resistant layer is activated.

8. A method according to claim 7, wherein said implanted radiation-resistant layer consists of the implanted elements boron and carbon.

9. A method according to claim 1, further including forming a plurality of radiation-resistant layers, said radiation-resistant layers including at least one of an oxide of hafnium, an oxide of aluminum, an oxide of silicon, a fluoride of magnesium, a fluoride of calcium, a fluoride of lithium, or an activated implanted layer of boron and carbon.

10. A method according to claim 1, wherein the radiation-resistant layer has a thickness of about 30 nm to 70 nm.

11. A method according to claim 1, wherein the radiation-resistant layer has a thickness of about 2 nm to 50 nm.

12. A method according to claim 1, wherein the radiation-resistant layer has a thickness of about 50 nm to 100 nm.

13. The method according to claim 1, wherein the movable modulating element comprises aluminum.

14. The method according to claim 1, wherein the movable modulating element comprises one or more materials silicon nitride, silicon, titanium, tantalum or tungsten.

15. A method according to claim 1, wherein said material composition for the radiation-resistant layer is an averaged bulk composition from an upper portion of the layer to a lower portion of the layer.

16. A method according to claim 3, wherein said material composition for any one of the plurality of radiation-resistant layer is an averaged bulk composition from an upper portion of the layer to a lower portion of the layer.

17. A method according to claim 1, further including, prior to forming the radiation-resistant layer, forming a reflective layer including one or more of aluminum, silver and gold.

18. A method according to claim 1, wherein said movable modulating element has a back side, further including forming on said back side at least one anti-reflective layer.

19. A method according to claim 18, wherein said anti-reflective layer comprises CaF2 or MgF2.

20. A method according to claim 18, wherein said anti-reflective layer comprises a fluoride of Magnesium or Calcium.

21. A method according to claim 18, wherein said anti-reflective layer has a thickness of about 15 nm to 80 nm.

22. A method according to claim 18, wherein said anti-reflective layer has a thickness of about 40 nm to 60 nm.

23. A method according to claim 18, wherein said anti-reflective layer has a thickness of about 60 nm to 80 nm.

24. A method according to claim 1, wherein said movable modulating element transmits electromagnetic radiation.

25. A method according to claim 24, wherein said movable modulating element is substantially transparent to wavelengths less than or equal to 248 nm.

26. A method according to claim 24, wherein said movable modulating element comprises an oxide of silicon.

27. A method according to claim 24, wherein said radiation-resistant layer comprises one layer.

28. A method according to claim 24, wherein radiation-resistant layer comprises a plurality of layers.

29. A method according to claim 24, wherein said radiation-resistant layer comprises a fluoride of magnesium or calcium.

30. A method according to claim 24, wherein said radiation-resistant element is two or more oxides of aluminum or silicon.

31. A method according to claim 1, further including, prior to forming the radiation-resistant layer, planarizing the front side.

32. The method of claim 31, wherein the front side, after the planarizing, has an RMS flatness of better than 2 nm.

33. The method of claim 31, wherein the front side, after the planarizing, has an RMS flatness of better than 1 nm.

34. The method of claim 31, wherein the front side, after the planarizing, has an RMS flatness of better than 0.5 nm.

35. The method of claim 31, wherein the planarizing includes CPM with an abrasive particle size of less than 300 nm.

36. The method of claim 31, wherein the planarizing includes CPM with an abrasive particle size of about 70 nm.

37. The method of claim 31, wherein the planarizing includes CPM with an abrasive particle size of about 50 nm.

38. At least one movable modulating element of an optical micro-electromechanical system (MEMS), comprising:

a front side; and at least one radiation-resistant layer over the front side, wherein said radiation-resistant layer is substantially reflective of radiation at an operating wavelength of about 248 nm or less.

39. At least one movable modulating element of an optical micro-electromechanical system (MEMS), comprising:

a front side; and at least one radiation-resistant layer over the front side, wherein the movable modulating element and the radiation-resistant layer are substantially transmissive at an operating wavelength of about 248 nm or less.

40. At least one movable modulating element of an optical micro-electromechanical system (MEMS), comprising:

a front side; and at least one radiation-resistant layer over the front side, wherein said radiation-resistant layer includes at least one of hafnium oxide (HfO2), magnesium fluoride (MgF2), aluminum oxide (Al2O3), silicon dioxide (SiO2) or lithium fluoride (LiF2).

41. At least one movable modulating element of an optical micro-electromechanical system (MEMS), comprising:

a front side; and at least one radiation-resistant layer over the front side, wherein said radiation-resistant layer includes an oxide of hafnium, an oxide of aluminum or an oxide of silicon.

42. At least one movable modulating element of an optical micro-electromechanical system (MEMS), comprising:

a front side; and at least one radiation-resistant layer over the front side, wherein said radiation-resistant layer includes a fluoride of magnesium, a fluoride of calcium or a fluoride of lithium.

43. At least one movable modulating element of an optical micro-electromechanical system (MEMS), comprising:

a front side; and at least one radiation-resistant layer over the front side, wherein said radiation-resistant layer is an implanted layer at the front side of the movable modulating element.

44. At least one movable modulating element of an optical micro-electromechanical system (MEMS), comprising:

a front side; and at least one radiation-resistant layer over the front side, wherein the front side is flat, having an RMS of 2 nm or better.

45. At least one movable modulating element of an optical micro-electromechanical system (MEMS), comprising:

a front side; and at least one radiation-resistant layer over the front side, further including:
  a back side of the movable modulating element; and
  at least one anti-reflective layer formed on the back side.

46. At least one movable modulating element of an optical micro-electromechanical system (MEMS), comprising:

a front side; and at least one radiation-resistant layer over the front side, further including:
  a non-movable substrate below the movable modulating element, to which the movable element is movably coupled; and
  at least one anti-reflective layer formed on a part of the non-movable substrate.

* * * * *